United States Patent [19]

Silveira, Jr.

[11] 3,958,858
[45] May 25, 1976

[54] MODIFIED CIRCUIT CARD EXTENDER

[75] Inventor: Robert J. Silveira, Jr., Raynham, Mass.

[73] Assignee: The United States of America as represented by the Secretary of the Navy, Washington, D.C.

[22] Filed: Sept. 10, 1975

[21] Appl. No.: 612,111

[52] U.S. Cl. .......................... 339/186 M; 339/17 L
[51] Int. Cl.² ....................................... H01R 13/64
[58] Field of Search ................ 339/17, 65, 66, 176, 339/184–186

[56] References Cited
UNITED STATES PATENTS

| | | | |
|---|---|---|---|
| 3,364,458 | 1/1968 | Black, Jr. et al. | 339/184 M |
| 3,582,867 | 6/1971 | Thompson et al. | 339/184 M |

Primary Examiner—Joseph H. McGlynn
Attorney, Agent, or Firm—Richard S. Sciascia; Arthur A. McGill; Prithvi C. Lall

[57] ABSTRACT

An electronic circuit card extender for providing mechanical as well as electrical interfacing of a printed circuit card or board in an electronic system to its corresponding mating plug on a chassis. The circuit card extender comprises a frame having etching or wiring on one side thereof, to extend the configuration of electrical connections from the circuit card to the corresponding plug on the chassis and a pair of bushings used for keying purposes. Each bushing is mounted on a rotatable shaft which extends along the body of the extender frame to the plug or the chassis connector at one end and has a keying pin at the other end thereof.

5 Claims, 2 Drawing Figures

MODIFIED CIRCUIT CARD EXTENDER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates to electronic systems such as computers, wherein certain components maybe mounted on a large number of generally similar printed circuit boards or cards arranged to be plugged in corresponding pin plates or plugs on a chassis. More particularly, the invention resides in a modified circuit card extender which provides circuit card keying and mating alignment pins, thus bringing out the electrical connections of a particular printed circuit card or board outside the chassis area for easy access for testing and repair.

In electronic systems such as a computer which use keyed printed circuit cards or boards, quick trouble shooting of a malfunctioning circuit card is quite important and the use of keyed circuit cards in such systems is quite common. However, no provisions are usually made for transmitting the card keying along the electrical connections along the body of a circuit card extender which is used for bringing out the electrical connections out in a more convenient place than the congested area where the particular circuit card board is located in the circuit. It is usually desirable that a circuit card extender must be universal, and be able to accept any circuit card and be acceptable by any location on the chassis. This is commonly accomplished by having no keying arrangement at all on the circuit card extender, or by having a universal fixed or rotatable key arrangement on the extender portion which mates with the pin plate or chassis connections but has no correlation with the portion of the circuit card extender which meets with the printed circuit card or board. Where no keying is provided at all, the extender configuration will allow any circuit card or board to be inserted into any chassis location, which defeats the purpose of card keying to prevent any damage to electrical equipment by inadvertently plugging the wrong circuit card into the plug or connector for specific card or board on the chassis. Another disadvantage of such a system is that without the keying pins on the card extender body, chassis mating alignment which is secondary function of these keys is lost, thereby allowing bending of electrical pins due to misalignment of high density mating connections. In the case where some sort of keying is provided only at the card extender interface with the chassis, the alignment problem is solved but the problem of inserting an incorrect circuit card or board into a given location is still possible. Furthermore, due to the small size and space limitations usually imposed by the system configuration, this type of arrangement is prone to damage or breakage. Both types of extenders are thus unsatisfactory as they permit expensive and extensive damage to electronic systems during testing and trouble-shooting when circuit card extenders are used.

SUMMARY OF THE INVENTION

The object and advantages of the present invention are accomplished by utilizing a modified circuit card extender according to the teachings of subject invention which provides a mechanical as well as an electrical interface of a circuit card or board to its mating pin plate or plug on a chassis via the use of the circuit card extender. The circuit card extender comprises a frame having an etching or wiring thereon to extend a configuration of electrical connections from a circuit card or board to the corresponding configuration of connections on a pin plate or plug of the chassis and a pair of bushings for keying purposes. Each bushing is mounted on a rotatable shaft which extends along the body of the frame of the extender with the pin plate or chassis connector at one end and having a keying pin at the other end. In operation, a circuit card or board is manually inserted into or interfaced with the circuit card extender on one side of the extender and the bushings are adjusted so as to mate the circuit card or board with the extender at the extender-card interface. This automatically sets the orientation at the pin plate or chassis plug-extender interface. Once this keying arrangement is established, the card extender will interface only with the pin plate or the chassis plug which corresponds to that particular circuit card or board for which the keying orientation has been accomplished.

An object of this invention is to have a modified circuit card extender which minimizes the damage to electronic systems during testing and trouble-shooting when the circuit card extender is being used.

Another object of this invention is to have a modified circuit extender which is flexible to be used for various circuit cards or boards of an electronic system.

Still another object of this invention is to have a circuit card extender which is inexpensive and is easy to fabricate.

Still another object of this invention is to have a modified circuit card extender which is keyed at the circuit card-extender interface as well as the chassis-extender interface.

Other objects, advantages, and novel features of the invention will become apparent from the following detailed description of the drawings when considered in conjunction with the accompanying drawings wherein:

DESCRIPTION OF A PREFERRED EMBODIMENT

Figures 1, 2:
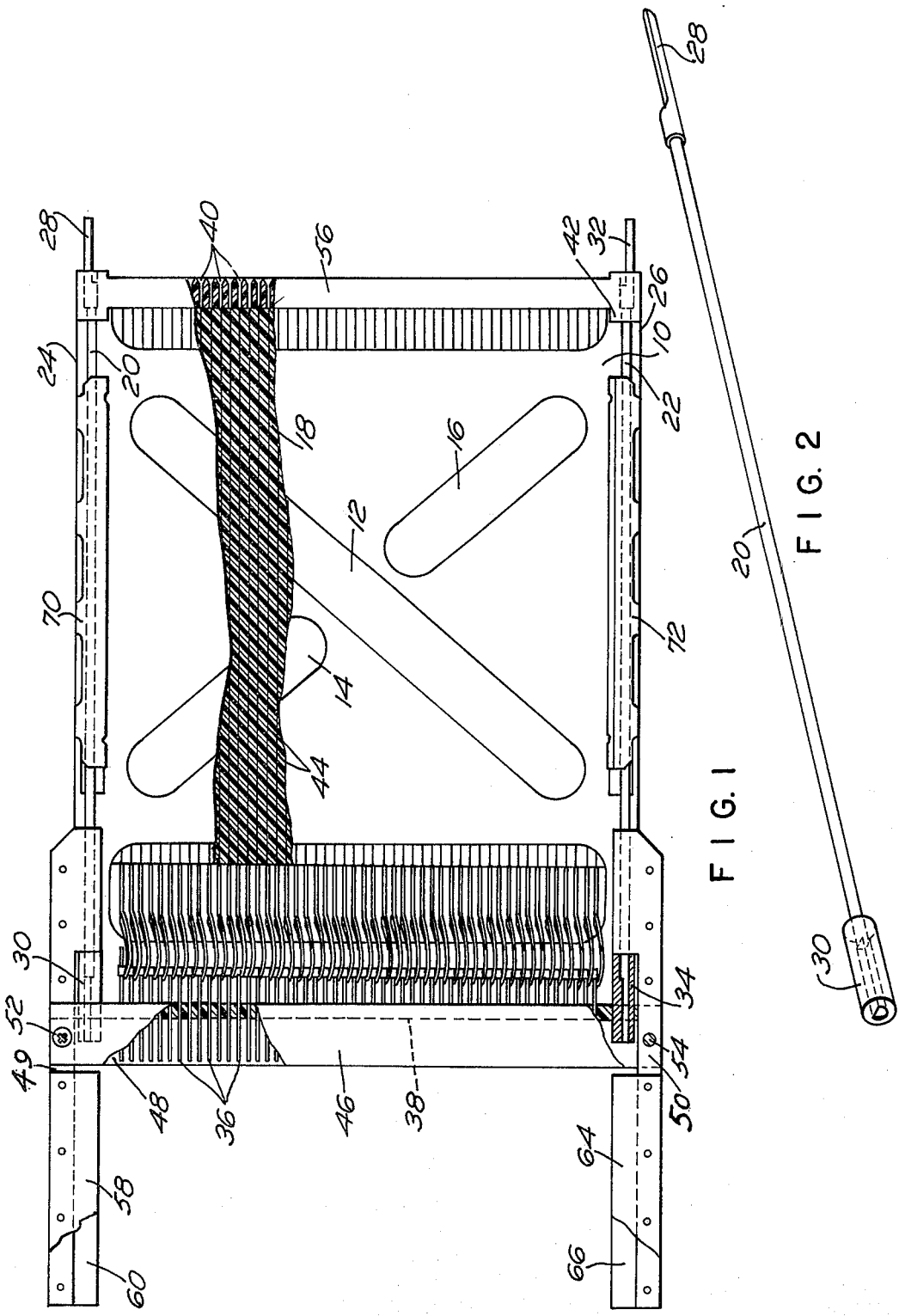
FIG. 1 is a perspective view, partially in cross section, of a modified circuit card extender showing a preferred embodiment of subject invention.
FIG. 2 illustrates one of the rotatable shafts of the extender with a keying attached at one end and a keying pin at the other end for keying the circuit card extender both at the chassis-extender interface and at the circuit card-extender interface.

Referring now to the drawings, wherein like reference characters designate like or corresponding parts throughout the several views, there is shown in FIG. 1 a frame 10, preferably made of a metal, which has ridges 12, 14 and 16 stamped thereon for providing additional strength. A corresponding plastic frame 18, shown partially in cross section in FIG. 1, is secured to one face of frame 10. Elongated shafts 20 and 22 run along elongated sides 24 and 26 respectively of frame 10. Shaft 20 has a keying pin 28 at one end and a bushing 30 at the other end thereof. Likewise shaft 22 has keying pin 32 at one end and bushing 34 at the other end thereof. Each member of group 36 of electrical male connectors on side 38 is connected to corresponding member of group 40 of female electrical connectors at the opposite side 42 of frame 10 by means of the corresponding members of group 44 of electrical wires running through plastic board 18. Group 36 of male electrical connectors is protected from mechanical damage by means of two plastic strips 46 and 48 which are attached to metal pieces 49 and 50 by means of screws 52 and 54 as shown in FIG. 1. Group 40 of electrical female connectors at side 42 of frame 10 is protected by a cross strip 56 which is attached to frame 10. Parallel strips 58 and 60 are attached to piece 49 so as to form a channel and strips 64 and 66 are secured to piece 50 to form another channel at the other end of the metallic frame 10. The channels formed by strips 58 and 60, strips 64 and 66 are used as guiding channels for making electrical and mechanical connections of electric card extender to the corresponding plug or pin plate on the chassis of the electronic system. Shaft 20 is rotatably mounted on frame 10 and is held in position along longitudinal side 24 of frame 10 by means of a springy metallic strip 70. Likewise shaft 22 is rotatably mounted on frame 10 and is held in position along the longitudinal side 26 of frame 10 by means of strip 72. FIG. 2 shows a perspective view of shaft 20 having pin 28 at one end and a bushing 30 at the other end thereof. Pin 28 and bushing 30 are securely attached to shaft 20 to preserve a certain keying relationship between the two. A similar keying relationship is preserved between pin 32 and bushing 34 which are secured to the opposite ends of shaft 22.

In operation the circuit card extender is connected to the chassis plug or pin plate corresponding to a particular circuit card or board on the chassis by using the channels formed by strips 58 and 60 along side 24 and strips 64 and 66 along side 26 of frame 10. While making electrical and mechanical connections between various members of group 36 of male electrical connectors of circuit card extender to the corresponding members in the plug or pin plate of the chassis, the bushings 30 and 34 at end or side 38 of frame 10 are properly keyed by rotating shafts 20 and 22 to form a proper keying arrangement. This keying arrangement is then transferred to pins 28 and 32 at the opposite side or end 42 of frame 10 of the circuit card extender which is to be connected to the circuit card or board which is designed to be connected to that particular plug or connector of the chassis. Having accomplished a certain keying arrangement of pins 28 and 32, they can not be moved as the bushings at the other ends of shafts 20 and 22 can not now be moved as they are securely mated with the corresponding pins in the plug or connector of the chassis in the electronic system. Having accomplished the desirable keying arrangement for pins 28 and 32, each member of the group 38 of female electrical connectors can be connected to the corresponding electrical connectors on the circuit card or board. No other circuit board or card except the one which has the bushings oriented to mate with keyed pins 28 and 32 will be able to mate with the circuit card extender. Thus the circuit card extender brings out a particular circuit board or card away from the congested area in the chassis where it is normally secured and provides an easy access for quick testing and repair work.

In summary, it can be seen there is disclosed a modified circuit card extender which provides a mechanical connection between various members of the connectors on the circuit board or card to the corresponding members of the plug on the chassis and also provides a keying arrangement which eliminates any errors for inserting a wrong circuit card or board and thus connecting it to a wrong connector on the chassis of an electronic system. Furthermore, this keying arrangement preserves the universal adaptability of the circuit card extender as the keying arrangement can take on any desired position to accommodate any particular circuit card or board.

Obviously, many modifications and variations of the present invention are possible in the light of the above teachings. As an example, the shape of the frame and the material of which it is made of can vary without deviating from the teachings of subject invention. Furthermore, the keying arrangement of the bushings and the corresponding pins attached to the corresponding shafts can vary without deviating from the teachings of this invention. It is therefore understood that within the scope of the appended claims the invention maybe practiced otherwise than as specifically described.

I claim:

1. A circuit card extender for transferring the electrical connections of a printed circuit of an electronic system from a chassis connector in a congested chassis area thereof to a convenient testing area which comprises:
    an elongated frame having a first and a second longitudinal sides and a first and a second lateral sides;
    a plurality of male electrical connectors mounted on said first lateral side;
    a plurality of female electrical connectors mounted on said second lateral side;
    means for connecting each member of said plurality of male electrical connectors to a corresponding member of said plurality of female electrical connectors;
    a first elongated shaft rotatably mounted along said first longitudinal side of said frame;
    a second elongated shaft rotatably mounted along said second longitudinal side of said frame;
    keying means at both ends thereof for each of said first and second elongated shafts; and
    guiding means for coupling said frame to the chassis connector of the electronic system.

2. The circuit card extender of claim 1 wherein said frame includes a metallic plate and a plastic plate secured together.

3. The circuit card extender of claim 2 wherein means for connecting each member of said plurality of male electrical connectors to a corresponding member of said plurality of electrical connectors includes a plurality of generally parallel electrical wires secured to said plastic plate.

4. The circuit extender of claim 3 wherein said keying means at both ends thereof for the first and second elongated shafts includes a keying pin on one end of each of said first and second elongated shafts and a keying bushing on the other end of each of said first and second elongated shafts.

5. The circuit extender of claim 4 wherein said guiding means comprise two generally parallel channels, a first channel along said first elongated side and a second channel along said second elongated side of said frame.

* * * * *